United States Patent [19]

Akiyama

[11] 3,767,397

[45] Oct. 23, 1973

[54] PHOTOGRAPHIC TREATMENT FOR SEMICONDUCTOR DEVICES OR THE LIKE

[75] Inventor: Katsuhiko Akiyama, Kanagawa-ken, Japan

[73] Assignee: Sony Corporation, Tokyo, Japan

[22] Filed: Oct. 21, 1971

[21] Appl. No.: 191,355

Related U.S. Application Data

[63] Continuation of Ser. No. 811,425, March 28, 1969, abandoned.

[52] U.S. Cl. .......................... 96/36.2, 29/576, 96/36

[51] Int. Cl. .......................... G03c 5/00, H01l 7/00

[58] Field of Search .............................. 96/36, 36.2

[56] References Cited

UNITED STATES PATENTS

| | | | |
|---|---|---|---|
| 2,977,228 | 3/1961 | Gold | 96/35 PC |
| 3,366,519 | 1/1968 | Pritchard | 96/36.2 |
| 3,423,205 | 1/1969 | Skaggs | 96/36.2 |

*Primary Examiner*—Norman G. Torchin
*Assistant Examiner*—Alfonso T. Suro Pico
*Attorney*—Hill, Sherman, Meroni, Gross & Simpson

[57] ABSTRACT

A semiconductor device and method of making the same, which utilizes a novel photographic process that allows void areas of a positive photosensitive material layer to serve as an etching mask for forming electrode patterns or a metallic layer. The number of photosensitive layers is reduced in the present method and allows simplified manufacturing operations.

4 Claims, 27 Drawing Figures

INVENTOR.
KATSUHIKO AKIYAMA
BY Hill, Sherman, Meroni, Gross & Simpson
ATTORNEYS

PATENTED OCT 23 1973 3,767,397

SHEET 2 OF 4

INVENTOR.

KATSUHIKO AKIYAMA

BY Hill, Sherman, Meroni, Gross & Simpson ATTORNEYS

INVENTOR.

KATSUHIKO AKIYAMA

BY Hill, Sherman, Meroni, Gross & Simpson ATTORNEYS

INVENTOR.

KATSUHIKO AKIYAMA

BY Hill, Sherman, Meroni, Gross & Simpson
ATTORNEYS

PHOTOGRAPHIC TREATMENT FOR SEMICONDUCTOR DEVICES OR THE LIKE

This a continuation, of application Ser. No. 811,425, filed Mar. 28, 1969.

BACKGROUND OF THE INVENTION

1. Field of the Invention

This invention relates in general to photographic production of semiconductor devices, and in particular to a photographic treatment for semiconductor devices which makes it simpler to form patterns on the semiconductor elements with high precision.

2. Description of the Prior Art

Semiconductor devices in the prior art have utilized photosensitive material as, for example, KPR, to provide windows of desired patterns in the photosensitive material by photographic treatment. The photosensitive layer is utilized as a mask for subsequent etching, electroplating and so forth. The present method allows conventional semiconductor elements to be manufactured, but the method does not work satisfactorily when making beam-lead type integrated circuits and the flip-tip type semiconductor devices which use solder deposited on the elements for making external connections. This is because the exposure mask, or optical mask, and the photosensitive layer cannot be held in close contact with each other, and the exposing radiation rays are not perfectly parallel, which causes the resulting pattern to be defocused at the edges. This makes it impossible to obtain a mask with high precision.

SUMMARY OF THE INVENTION

The present invention eliminates the above drawbacks by using positive photosensitive material such as, for example, AZ, which is removed by a developing process only at those areas which have been exposed to radiation such as light. In the present invention a positive photosensitive material layer which has been coated is employed as a mask in subsequent processes to simplify the overall manufacturing of semiconductor devices.

It is an object of this invention to provide a photographic treatment for semiconductor devices which is simple and inexpensive.

Another object of the invention is to provide photographic treatment performing precise patterns of semiconductor elements in the manufacture of semiconductor devices.

A further object is to provide a photographic treatment for precisely etching semiconductor elements of uneven surfaces.

Yet another object of the invention is to provide photographic treatment for precisely electroplating semiconductor elements which have uneven surfaces according to predetermined patterns.

Other objects features and advantages of this invention will become apparent from the following description taken in conjunction with the accompanying drawings in which:

BRIEF DESCRIPTION OF THE DRAWINGS

FIGS. 2–8 are enlarged diagrammatic views illustrating steps in the manufacture of semiconductor devices with the use of the photographic treatments of this invention.

DESCRIPTION OF THE PREFERRED EMBODIMENTS

Figure 1A:
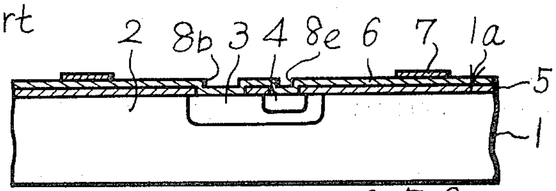
Prior Art Fig. 1A
FIGS. 1A–1H disclose prior art methods for manufacturing semiconductor devices utilizing conventional photographic processes.

FIGS. 1A–1H illustate the prior art method of making a flip-tip transistor. In each of these figures the reference numeral 1 represents the semiconductor substrate which comprises the collector region 2, a base region 3 which is formed in one portion of the semiconductor substrate, and an emitter region formed in a portion of the substrate. A layer 5 of insulation material as, for example, silicon dixoide, $SiO_2$, is formed over the upper surface of the semiconductor substrate 1.

In a first step portions of the insulating layer 5 are removed by photoetching to form windows 8*b* and 8*c* to expose the surface of the base and emitter regions 3 and 4. A window would also be provided over the collector region 2, but for simplicity it is not illustrated in the drawings.

A conductive layer 6, for example, of aluminum, forms a good bond with the semiconductor substrate 1 and the insulating layer 5 is formed by vapor deposition over the insulating layer 5 and the portion of the substrate 1 that is exposed by the windows 8*b* and 8*c*.

Strips of conductive material 7, for example, of nickel, are deposited on the metal layer 6 at points where metallic bumps are to be attached.

Figure 1B:
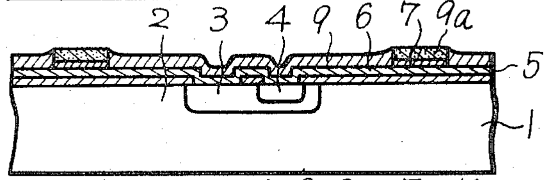
Figure 1C:
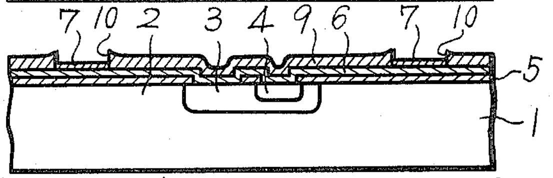
Figure 1D:
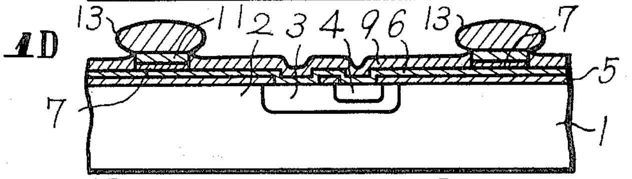

A positive photosensitive material layer 9 that might, for example, be AZ, is coated on the upper surface of substrate 1 as illustated in FIG. 1B. AZ is a positive phtoresist marketed by the Shipley Company Inc. whose address is 2,300 Washington Street, Newton, Mass. 02162. AZ positive working photoresist materials are described in U. S. Pats. No. 3,046,120 and No. 3,046,121, and especially at column 3, lines 10–30 of U.S. Pat. No. 3,046,120. The positive photosensitive layer 9 is then exposed selectively to light at those areas where the metal bumps will be formed which are at those areas overlying the nickel layer 7 (FIG. 1B). Then the positive photosensitive material layer 9 is subjected to a developing process to selectively remove the layer 9 at those areas 9*a* which have been exposed to light, thus forming windows 10 (FIG. 1C). Thereafter, nickel is plated on the metal layer 7, which is exposed through the windows 10 as indicated at 11 while using the positive photosensitive material layer 9 as a mask and the aluminum layer 6 as one electrode. The resulting nickel layer 11 is electroplated with a metal such as tin, Sn, or the like, which will ultimately form metal bumps, thus providing metal bumps 13 (FIG. 1D).

Figure 1E:
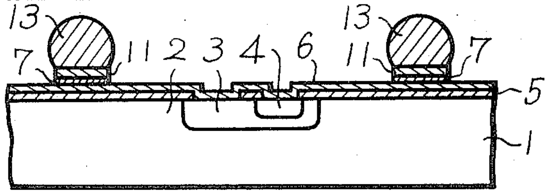

Subsequent to the formation of the metal bumps 13 the positive photosensitive material layer 9 is removed. If necessary the metal bumps 13 may be heated until they are molten and will form globular shapes due to surface tension, as shown in FIG. 1E.

Figure 1F:
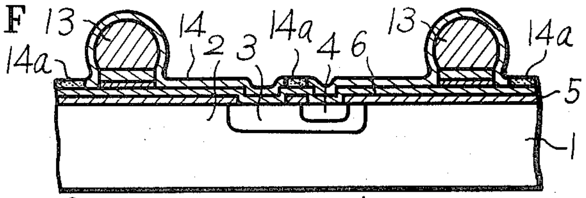

A positive photosensitive material layer 14 similar to layer 9, which might be, for example, an AZ material, is coated on the metal layer 6 and is then exposed to light at those areas 14a where an electrode will not be ultimately located (see FIG. 1F.).

Figure 1G:
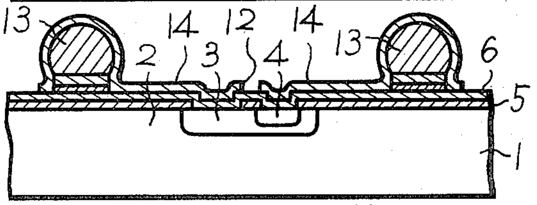
Figure 1H:
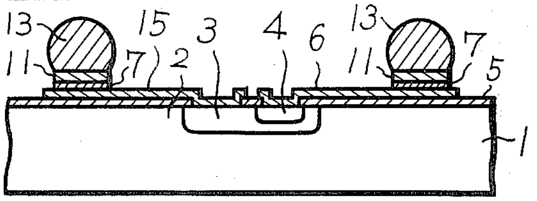

Then the positive photosensitive material layer 14 is selectively removed at those areas 14a which have been exposed to light to provide void areas 12 (FIG. 1G).

Next, the metal layer 6 is exposed through the void areas 12 and is removed by etching. The remaining positive photosensitive material layer 14 is used as an etching mask and then the photosensitive material layer 14 is entirely removed (FIG. 111). Thus, a flip-tip type transistor is formed in which electrodes 15 formed of the aluminum layer 6 and electrically interconnected are provided on the collector, base and emitter regions. The metal bumps 13 are formed on the electrodes 15.

With the foregoing method, however, the exposure of the photosensitive layer 14 to light described with FIG. 1F is carried out under such a condition that the metal bumps 13 remain projecting and consequently the exposure mask cannot be directly attached to the photosensitive material layer 14 and high precision cannot be expected in the exposure process.

The present invention resides in the provision of a novel photographic treatment for semiconductor devices or the like which is free from the drawbacks of the prior art. This invention is based upon the fact that in the making of the flip-tip type semiconductor tip such as shown in FIG. 1, the void areas 12 of the positive photosensitive material layer 14 serving as an etching mask for forming the electrode patterns on the metal layer 6 are not located within the areas of the windows 10 of the photosensitive material layer 9 shown in FIGS. 1B and 1C, but the windows 10 may be positioned within the areas of the void areas 12. In the present invention the photosensitive material layers 9 and 14 are formed as a single positive photosensitive material layer, which is used as a plating resist in the plating of the metal layer 11 and the metal bumps 14 and as an etching mask in the etching of the metal layer 6, to thereby simplify the manufacturing operations.

FIGS. 2 to 8 disclose the present invention as applied to the production of the flip-tip transistors.

Figure 2A:
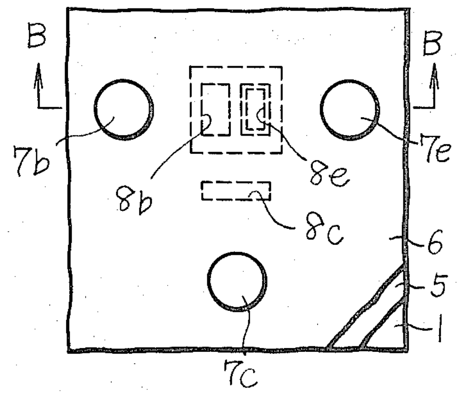
FIGS. 2A, 3A, 4A, 5A, 6A, 7A and 8A are plan views.
Figure 2B:
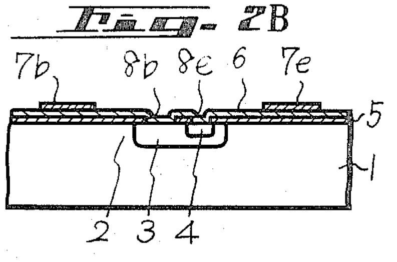
FIGS. 2B, 3B, 4B, 5B, 6B, 7B and 8B are sectional views taken on line B-B from their corresponding plan view figures.

The first step is to prepare a semiconductor substrate 1 (FIGS. 2A and 2B). Since the semiconductor substrate 1 may be identical in construction to that described with FIG. 1A, portions corresponding to those in FIG. 1A are identified by the same reference numerals and the description will not be repeated. In the illustrated embodiment windows 8c, 8b and 8e are formed in an insulating layer 5 at selected positions on collector, base and emitter regions 2, 3 and 4. A metal layer 6 as of aluminum or the like is coated, for example, by vapor deposition on the entire area of the upper surface of the substrate 1 while being in ohmic contact with the collector, base and emitter regions 2, 3 and 4. Also, a nickel or like metal layer is vapor-deposited, as usual, over the entire area of the metal layer 6 and is then selectively etched away to leave those areas such as indicated by 7*c*, 7*b* and 7*e* where metal bumps for the collector, base and emitter will be ultimately formed.

Figure 3A:
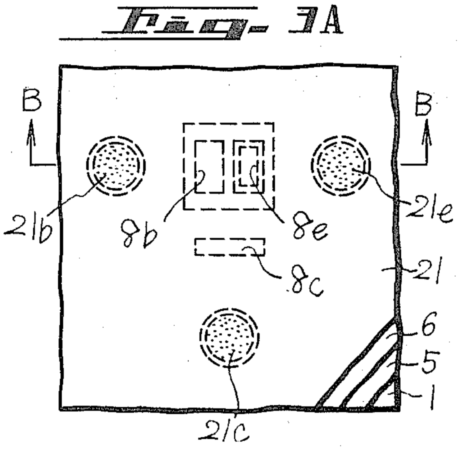
Figure 3B:
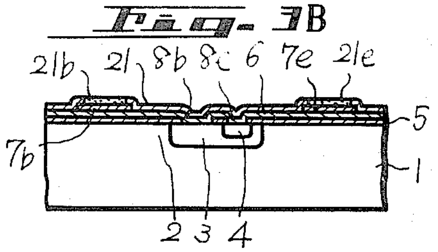

Therafter, a positive photosensitive material layer 21 as of, for example, AZ (Trademark) is coated over the upper surface of the substrate, including the metal layers 6 and 7, and is then exposed to irradiation by light at those areas which will ultimately be occupied by the metal bumps, that is, at those areas 21*c*, 21*b* and 21*e* overlying the metal layers 7*c*, 7*b* and 7*e* (FIGS. 3A and 3B).

Figure 4A:
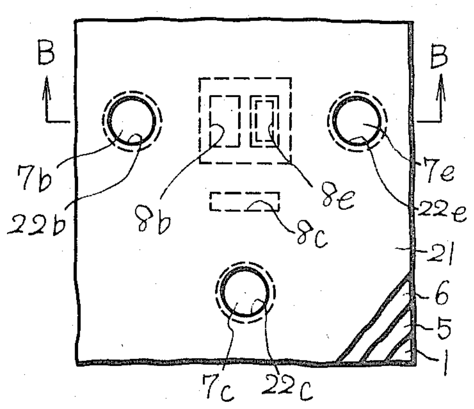
Figure 4B:
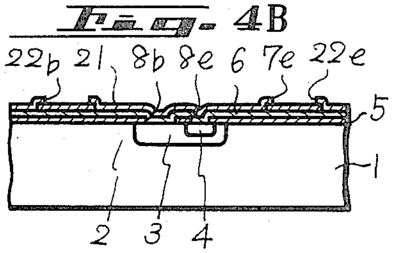

Then, the positive photosensitive material layer 21 is subjected to a developing process to remove the areas 21*c*, 21*b* and 21*e* exposed to light, thus providing windows 22*c*, 22*b* and 22*e* in the layer 21 (FIGS. 4A and 4B).

Following the above developing process, the remaining positive photosensitive material layer 21 is further subjected to an exposure process prior to the formation of the metal bumps using the layer 21 as a plating resist. The layer 21 is exposed to irradiation by light to form therein a latent image at an area 21′ except those areas where electrode patterns will be formed, that is, those areas which respectively extend from the windows 22*c*, 22*b* and 22*e* to the windows 8*c*, 8*b* and 8*e* (FIGS. 5A and 5B).

Figure 6A:
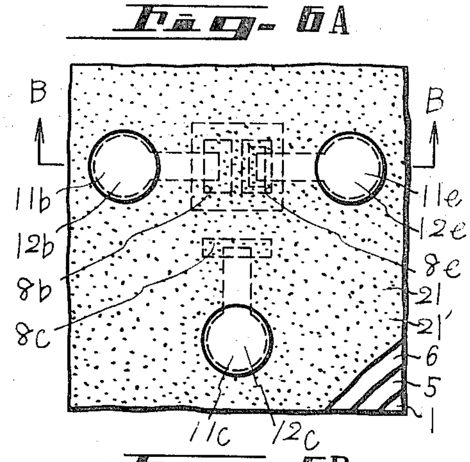
Figure 6B:
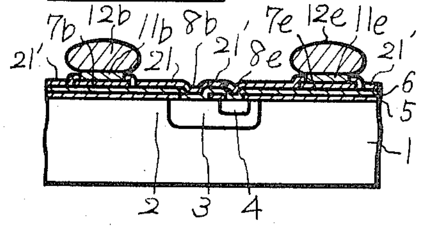

After this, the positive photosensitive material layer 21 is not subjected to a developing process but, instead, nickel or like metal layers 11*c*, 11*b* and 11*e* are plated on the metal layers 7*c*, 7*b* and 7*e* exposed through the windows 22*c*, 22*b* and 22*e* while employing the layer 21 as a plating resist and the aluminum layer 6 as one electrode. The metal bumps of tin, for example, are plated on the metal layers 11*c*, 11*b* and 11*e* with a thickness of 10 to 50 microns (FIGS. 6A and 6B).

In the plating of the metal layers 11*c*, 11*b* and 11*e* and the metal bumps 12*c*, 12*b* and 12*e*, if pin holes or other faults exist in the positive photosensitive material layer 21, the nickel will be plated through the pin holes at points other than those areas where the metal bumps are to be located. To avoid this, the surface of the metal layer 6 is oxidized, except at those areas occupied by the metal layers 7 to form an insulating oxide film or, alternatively, a metal layer such as titanium can be formed on the metal layer 6 and the surface of the titanium layer subjected to anoidic oxidation to form an insulating oxide film on the surface of the metal layer 6 except at those areas underlying the metal layers 7.

Figure 5A:
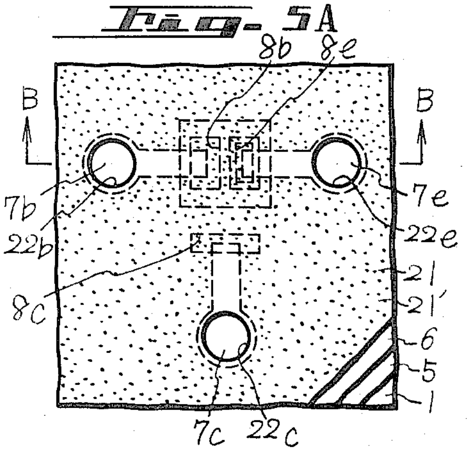
Figure 5B:
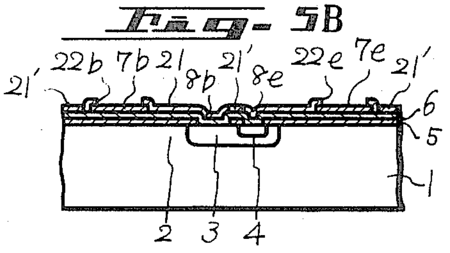
Figure 7A:
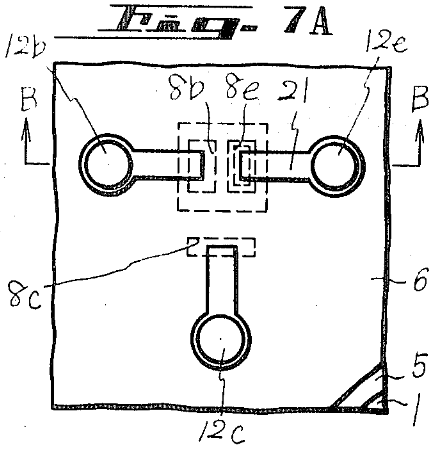
Figure 7B:
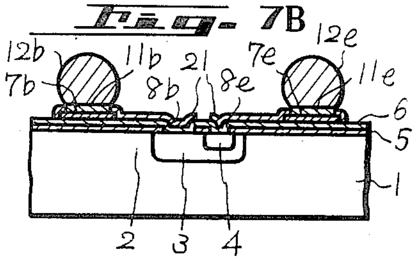

Subsequent to the formation of the metal bumps 12c, 12b and 12e, the positive photosensitive material layer having a latent image formed by the second exposing process described with FIGS. 5A and 5B is subjected to a developing process to remove the area 21′ which has been exposed to light, leaving those areas where metal electrode patterns will be ultimately formed (FIGS. 7A and 7B).

Figure 8A:
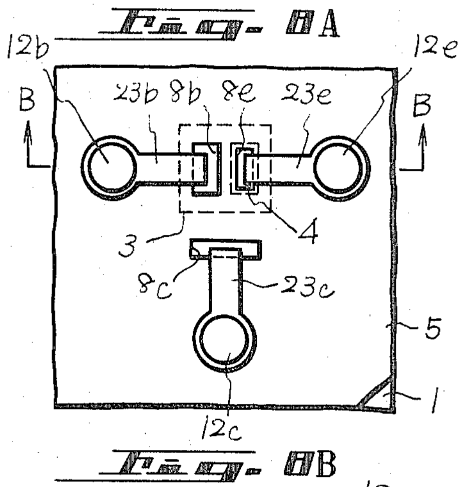
Figure 8B:
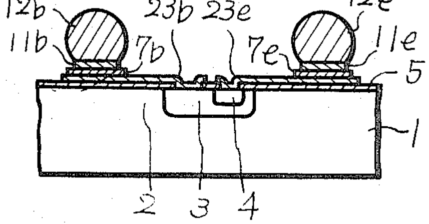

Thereafter, the metal layer 6 is selectively etched away, with the remaining positive photosensitive material layer 21 serving as a mask, while leaving thsoe areas underlying the layer 21. The remaining discrete metal layers 6, respectively, constitute collector, base and emitter electrodes 23c, 23b and 23e which electrically connect the collector, base and emitter regions 2, 3 and 4 with the metal bumps 12c, 12b and 12e (FIGS. 8A and 8B).

It is also possible that the metal bumps 22c, 22b and 22e may be fused by heating to be of globular form due to surface tension. A silver layer may be plated on the globular metal bumps.

As has been described above, the present invention employs the same positive photosensitive material layer 21 in the two photographic treatments; that is, in the first photographic treatment the photosensitive material layer 21 is used as a plating resist for selective plating of the metal layers 12 on which the metal bumps are to be provided and in the second photographic treatment the layer 21 is sued as an etching mask for selective etching of the metal layer 6.

For the second photographic treatment, immediately after the developing process of the first photographic treatment, the layer 21 is exposed to form therein a latent image as the etching mask. Under such conditions the plating process of the metal layers 12 is carried out and the metal bumps are formed on the layers 12. Thereafter, the photosensitive material layer 21 is developed, and selective etching of the metal layer 6 is achieved by employing the layer 21 as the etching mask. Consequently, the present invention dispenses with the coating of the photosensitive material layers in the processes which are required in the prior art and, in addition, since the exposing process for the second photographic treatment is done prior to the formation of the metal bumps 12*c*, 12*b* and 12*e*, the exposing process can be done with the maks directly attached to the photosensitive material layer 21 to assure the formation of the etching mask with a precise pattern.

While the present invention has been described as applied to the flip-tip type transistor, it will be seen that the invention is applicable to other various types of semiconductors or flip-tip type semiconductor integrated circuits. Further, the methods of this invention may be used in the production of integrated circuits of the type having beam leads.

FIG. 9 illustrates the present invention as applied to making a semiconductor integrated circuit having beam leads. In the example illustrated the first step is to prepare a semiconductor substrate 31 in which a resistance element *r* and a transistor element *t* have been formed, for example, by diffusion, while being exposed at one surface 31*a* of the substrate 31 (FIG. 9A). Reference numeral 32 indicates an insulating layer as of silicon dioxide coated on the semiconductor substrate 31. The insulating layer 32 has formed therein, by means of photoetching or the like, windows 33*r* and 33*r'* at both ends of the resistance element *r* and windows 33*c*, 33*b* and 33*e* at selected areas on the collector, base and emitter regions 34*c*, 34*b* and 34*e* of the transistor element *t*.

The insulating layer 32 has covered over its entire surface with an aluminum or like metal layer 35 which is in ohmic contact with the resistance element *r* and the respective regions of the transistor elements *t* through the windows 33*r*, 33*r'* 33*c*, 33*b* and 33*e*.

Figure 9A:
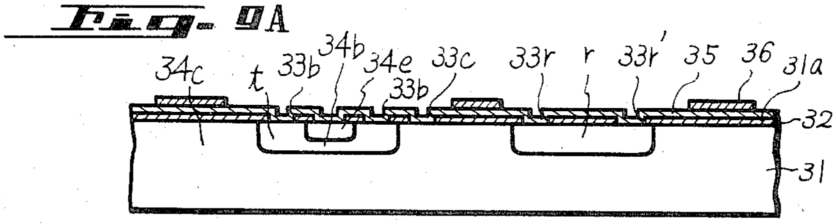
FIGS. 9A–9E illustrate a modified form of the invention.
Figure 9B:
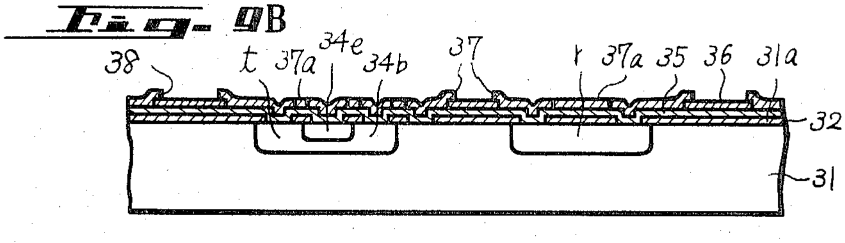
Figure 9C:
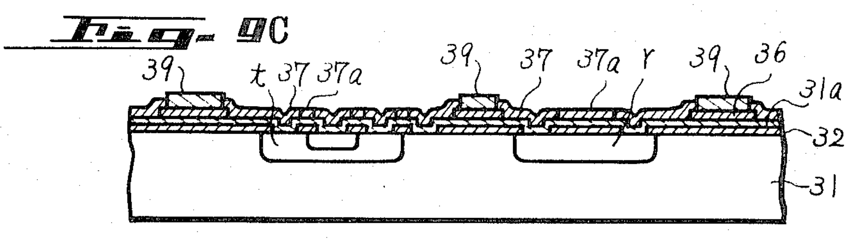

Also, the metal layer 35 has selectively deposited thereon a nickel or like metal layer 36 at those areas where the beam leads are to be formed, that is, between the transistor element *t* and the resistance element *r* and/or between these elements *t* and *r* and other elements or terminals, not shown. The selective formation of the metal layer 36 is done by selectively etching the layer 36 vapor-deposited on the entire surface of the metal layer 35 to remove the unnecessary areas. In the present invention a positive photosensitive material layer 37 of, for example, AZ (Trademark), is coated over the metal layers 35 and 36 and is then exposed to light at those areas where the beam leads will be ultimately formed. It is thereafter subjected to a developing process to remove those areas exposed to light, thus providing windows 38 in the photosensitive material layer 37, as shown in FIG. 9B. Next, the positive photosensitive material layer 37 is further exposed to light at areas 37*a*, except at those areas where the electrodes and beam leads will be formed. This exposing process is not followed by a developing process but, instead, the metal layer 36 is plated with nickel or gold through the windows 38 of the photosensitive layer 37, which serves as a plating resist. The beam leads have a thickness of about 10 to 15 microns, as indicated by 39 (FIG. 9C).

Figure 9D:
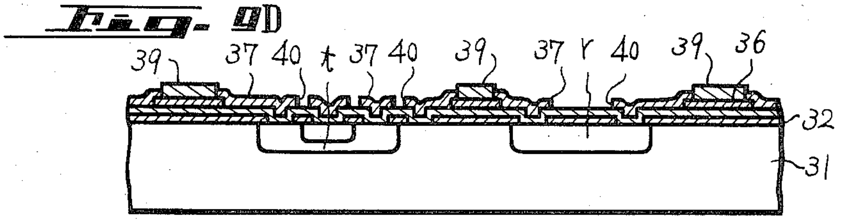

Then the photosensitive layer 37 is subjected to a developing process to remove the areas 37a which have been exposed to light during the second exposure to provide windows 40 (FIG. 9D).

Figure 9E:
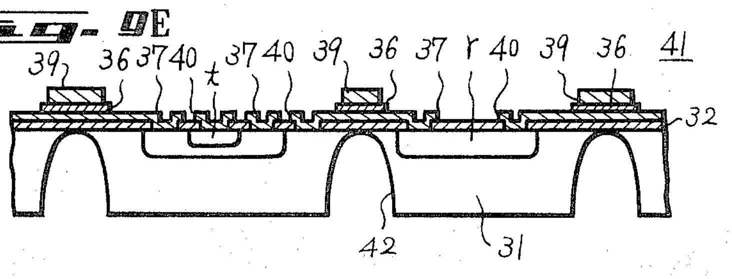

Then, the metal layer 35 is etched away at those areas exposed through the windows 40, with the photosensitive layer 37 being used as an etching mask. As a result, the metal layer 35 constitutes electrodes 43 for the collector, base and emitter regions of the transistor element *t* and both electrodes of the resistance elements. Further, the beam leads 39 overlying the electrodes 43 electrically interconnect the elements *t* and *r* or other elements or terminals as desired. Then, the semiconductor element 31 is selectively etched away from its underside at those areas underlying the metal layers 39, as indicated at 42, so as to provide insulation between the resistance element *r* and the transistor element *t* and between these elements and other elements in the so-called air isolation manner (FIG. 9E).

In this manner, a semiconductor integrated circuit 41 is provided in which the semiconductor elements *r* and *t* are electrically interconnected and are mechanically coupled together through the beam leads 39 in a predetermined pattern.

In the production of the semiconductor integrated circuit having beam leads with the method of the present invention, the etching mask for the selective etching of the metal layer 35 and the plating resist for the selective plating of the metal layer 39 are formed by the common photosensitive material layer, and the exposing process for the selective etching of the metal layer 35 is done by using the etching mask before the formation of the thick metal layer 39. This avoids the possibility of inaccurate masking of the metal layer 35 due to the presence of the thick metal layer 39, enables accurate exposure of the layer 39 and, at the same time, leads to simplification of the manufacturing operations, as in the former embodiment It will be seen that the foregoing embodiments are intended as being illustrative and should not be construed as limiting the present invention specifically thereto.

Although the present invention has been described in connection with the case where the metal bumps are provided on the semiconductor tip, it is to be understood that the invention is applicable where the metal bumps are formed on a header or a printed circuit board.

It will be apparent that many modifications and variations may be effected without departing from the scope of the novel concepts of this invention.

I claim as my invention:

1. A photographic treatment for semiconductor devices or the like comprising the steps in the following order of:

a. providing a base member,
b. coating a positive photosensitive AZ material layer on one surface of the base member,
c. exposing the positive photosensitive material layer to light at a first predetermined area,
d. developing the positive photosensitive material layer to remove it at the first predetermined area,
e. exposing the positive photosensitive material layer to light at a second predetermined area to form therein a latent image, f. electroplating the base member through the positive photosensitive material layer serving as a mask, and g. developing the positive photosensitive material layer to remove it at the second predetermined area.

2. A photographic treatment for semiconductor devices or the like comprising the steps in the following order of:

a. providing a base member, b. coating a positive photosensitive AZ material layer on one surface of the base member, c. exposing the positive photosensitive material layer to light at a first predetermined area, d. developing the positive photosensitive material layer to remove it at the first predetermined area, e. exposing the positive photosensitive material layer to light at a second predetermined area to form therein a latent image, f. electroplating the base member through the positive phtosensitive material layer serving as a mask, g. developing the positive photosensitive material layer to remove it at the second predetermined area, and h. selectively etching the base member using the positive photosensitive material layer as an etching mask.

3. A photographic treatment for semiconductor devices or the like comprising the steps in the following order of:

a. providing a base member, b. coating a positive photosensitive AZ material layer which does not lose its photosensitivity and adhesion during processing on one surface of the base member, c. exposing the positive photosensitive material layer to light at a first predetermined area, d. developing the positive photosensitive material layer to remove it at the first predetermined area, e. exposing the positive photosensitive material layer to light at a second predetermined area to form therein a latent image, f. electroplating the base member through the positive photosensitive material layer serving as a mask, g. developing the positive photosensitive material layer to remove it at the second predetermined area, and h. selectively etching the base member using the positive photosensitive material layer as an etching mask.

4. A photographic treatment for semiconductor devices according to claim 3 wherein said electroplating forms metal bumps on said base member which extend outwardly from its surface.

* * * * *